United States Patent [19]
Donde et al.

[11] Patent Number: 5,729,423
[45] Date of Patent: Mar. 17, 1998

[54] PUNCTURE RESISTANT ELECTROSTATIC CHUCK

[75] Inventors: Arik Donde, Austin, Tex.; Hyman J. Levinstein, Berkeley Heights, N.J.; Robert W. Wu, Pleasanton, Calif.; Andreas Hegedus, San Francisco, Calif.; Edwin C. Weldon, Los Gatos, Calif.; Shamouil Shamouilian, San Jose, Calif.; Jon T. Clinton, San Jose, Calif.; Surinder S. Bedi, Fremont, Calif.

[73] Assignee: Applied Materials, Inc., Santa Clara, Calif.

[21] Appl. No.: 755,716

[22] Filed: Nov. 25, 1996

Related U.S. Application Data

[63] Continuation-in-part of Ser. No. 381,786, Jan. 31, 1995, which is a continuation-in-part of Ser. No. 189,562, Jan. 31, 1994, abandoned.

[51] Int. Cl.$^6$ .................................. H02N 13/00
[52] U.S. Cl. ........................................ 361/234
[58] Field of Search .............................. 361/230, 233, 361/234; 269/8, 903; 279/128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,399,016 | 8/1983 | Tsukada et al. | 204/192 R |
| 4,480,284 | 10/1984 | Tojo et al. | 361/234 |
| 4,502,094 | 2/1985 | Lewin et al. | 361/234 |
| 4,565,601 | 1/1986 | Kakehi et al. | 156/643 |
| 4,645,218 | 2/1987 | Ooshio et al. | 279/1 M |
| 4,665,463 | 5/1987 | Ward et al. | 361/234 |
| 4,771,730 | 9/1988 | Tezuka | 118/723 |
| 4,778,326 | 10/1988 | Althouse et al. | 414/786 |
| 4,832,781 | 5/1989 | Mears | 156/234 |
| 4,999,507 | 3/1991 | Clemens et al. | 250/492.2 |

(List continued on next page.)

FOREIGN PATENT DOCUMENTS

| | | |
|---|---|---|
| 0171011 | 2/1986 | European Pat. Off. . |
| 0439000A1 | 1/1991 | European Pat. Off. . |
| 0452222 | 10/1991 | European Pat. Off. . |
| 0473930 | 3/1992 | European Pat. Off. . |
| 0439000B1 | 4/1994 | European Pat. Off. . |
| 0635869A1 | 1/1995 | European Pat. Off. . |
| 61-56842A | 3/1986 | Japan . |
| 63-031732 | 2/1988 | Japan . |
| 1-298721 | 12/1989 | Japan . |
| 2-27748 | 1/1990 | Japan . |
| 3286834 | 12/1991 | Japan . |
| 3286835 | 12/1991 | Japan . |
| 4367247 | 12/1992 | Japan . |
| 5069489 | 3/1993 | Japan . |

OTHER PUBLICATIONS

Klein, Allen J., "Curing Techniques for Composites," *Advanced Composites*, Mar./Apr. 1988, pp. 32–44.

Nakasuji, et al., "Low Voltage and High Speed Operating Electrostatic Wafer Chuck," *J. Vac. Sci. Technol. A.*, vol. 10, No. 6, Nov./Dec. 1992, pp. 3573–3578.

Watanabe, et al., "Electrostatic Force and Absorption Current of Alumina Electrostatic Chuck," *Jpn. J. Appl. Phys.*, vol. 31 (1992) Pt. 1, No. 7, pp. 2145–2150.

(List continued on next page.)

*Primary Examiner*—Fritz Fleming
*Attorney, Agent, or Firm*—Ashok K. Janah; Peter J. Sgarbossa

[57] ABSTRACT

A puncture resistant electrostatic chuck (20) is described. The chuck (20) comprises at least one electrode (25); and a composite insulator (30) covering the electrode. The composite insulator comprises a matrix material having a conformal holding surface (50) capable of conforming to the substrate (35) under application of an electrostatic force generated by the electrode to reduce leakage of heat transfer fluid held between the substrate and the holding surface. A hard puncture resistant layer, such a layer of fibers or an aromatic polyamide layer, is positioned below the holding surface (50) and is sufficiently hard to increase the puncture resistance of the composite insulator.

45 Claims, 4 Drawing Sheets

U.S. PATENT DOCUMENTS

| | | | |
|---|---|---|---|
| 5,055,964 | 10/1991 | Logan et al. | 361/234 |
| 5,104,834 | 4/1992 | Watanabe et al. | 501/127 |
| 5,151,845 | 9/1992 | Watanabe et al. | 361/234 |
| 5,166,856 | 11/1992 | Liporace et al. | 361/233 |
| 5,213,349 | 5/1993 | Elliott | 279/128 |
| 5,255,153 | 10/1993 | Nozawa et al. | 361/234 |
| 5,270,266 | 12/1993 | Hirano et al. | 437/228 |
| 5,275,683 | 1/1994 | Arami et al. | 156/345 |
| 5,280,156 | 1/1994 | Niori et al. | 219/385 |
| 5,324,053 | 6/1994 | Kubota et al. | 279/128 |
| 5,338,827 | 8/1994 | Serafini et al. | 528/353 |
| 5,377,071 | 12/1994 | Moslehi | 361/234 |
| 5,382,311 | 1/1995 | Ishikawa et al. | 156/345 |
| 5,452,177 | 9/1995 | Frutiger | 361/234 |
| 5,583,736 | 12/1996 | Anderson et al. | 361/234 |
| 5,636,098 | 6/1997 | Salfelder et al. | 361/234 |

OTHER PUBLICATIONS

Arlon brochure, "55NT Multifunctional Epoxy on Aramid Non–woven Reinforcement," 7 pages No Date.

Arlon brochure, "85NT Non–MDA Polymide on Aramid Non–woven Reinforcement," 3 pages No Date.

"Data Sheet—Breathers and Bleeders," Data Sheet from Airtech International, Inc., Carson, California (1993).

DuPont Advanced Fibers Systems brochure, "DuPont Thermount® Nonwoven Aramid Reinforcement for Printed Wiring Boards," 9 pages No Date.

DuPont Advanced Fibers Systems brochure, "NOMEX® Aramid Paper type 410 Typical Properties," 8 pages No Date.

"Kapton General Information," Technical Brochure from DuPont de Nemours Company, Wilmington, Delaware (1993).

"Kapton KJ" Technical Information from DuPont Films No Date.

"R/flex® 1100 High Temperature Materials," Data Sheet DS20903D, Rogers Corporation, Chandler, Arizona (1993).

IBM Technical Disclosure Bulletin, vol. 31, No. 1, Jun. 1988, pp. 461–464, "Electrostatic Wafer Holder for Wafer Cooling During Reactive Ion Etching".

International Search Report dated Jun. 9, 1995.

International Application entitled, "Electrostatic Chuck with Conformal Insulator Film"; Published under the Patent Cooperation Treaty (PCT) Publication Number WO 95/20838; International Publication Date: 3 Aug. 1995; International Application No. PCT/US95/01355.

U.S. Patent Application entitled, "An Electrostatic Chuck Having a Grooved Surface"; filed Jul. 20, 1993; Serial No. 08/94,640; Inventor: Steger; Attorney Docket No. 260.

U.S. Patent Application entitled, "Protective Coating for Dielectric Material on Wafer Support Used in Integrated Circuit Processing Apparatus and Method of Forming Same," filed Apr. 22, 1993; Serial No. 08/52,018; Inventors: Wu, et al.; Attorney Docket No. 428.

U.S. Patent Application entitled, "Electrostatic Chuck with Conformal Insulator Film," filed Jan. 31, 1995; Serial No. 08/381786; Inventors: Shamouilian, et al.; Attorney Docket No. 527.P1.

U.S. Patent Application entitled, "Electrostatic Chuck," filed Jan. 31, 1994; Serial No. 08/189562; Inventors: Shamouilian, et al.; Attorney Docket No. 527.

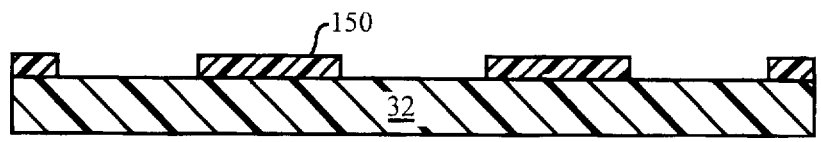
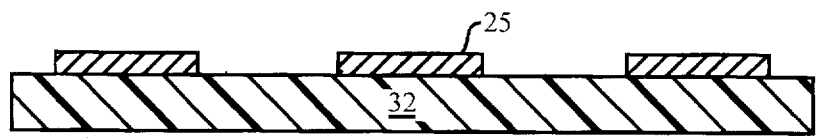
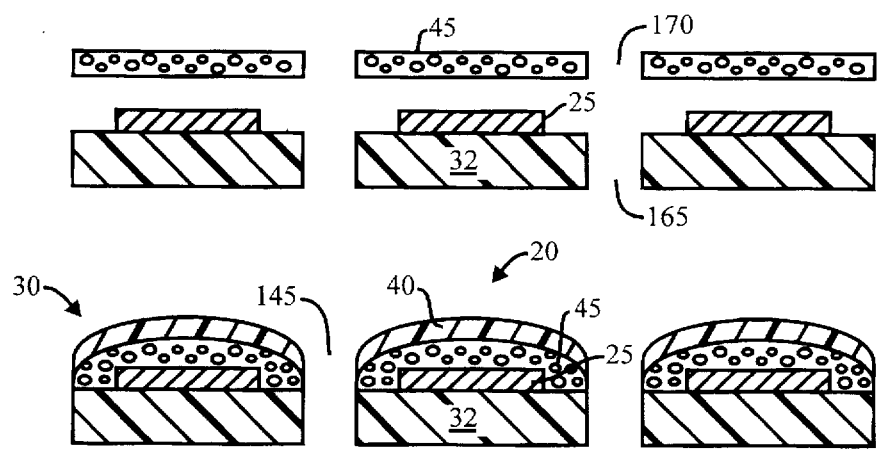
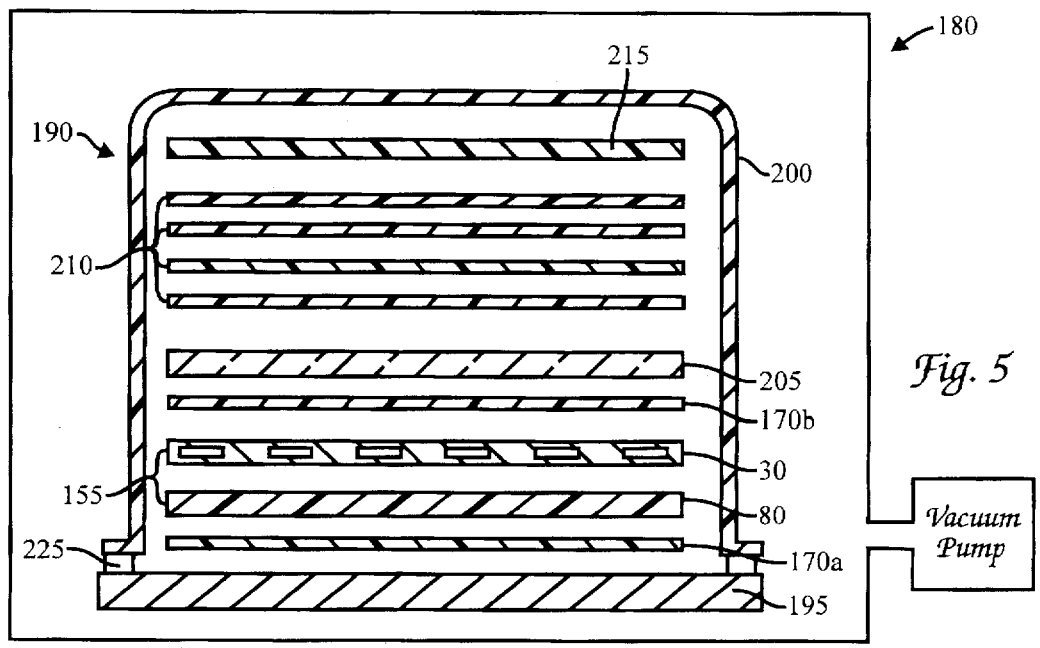

PUNCTURE RESISTANT ELECTROSTATIC CHUCK

CROSS-REFERENCE

This application is a continuation-in-part of U.S. patent application Ser. No. 08/381,786, entitled ELECTROSTATIC CHUCK WITH CONFORMAL INSULATOR FILM," filed on Jan. 31, 1995; which is a continuation-in-part of U.S. patent application Ser. No. 08/189,562, now abandoned entitled "ELECTROSTATIC CHUCK," filed Jan. 31, 1994, by Shamouilian, et al.—both of which are incorporated herein by reference.

BACKGROUND

The present invention is directed to an electrostatic chuck for holding a substrate in a process environment.

In integrated circuit manufacture, chucks are used to hold semiconductor substrates to prevent movement or misalignment of the substrate during processing. Electrostatic chucks, that use electrostatic attraction forces to hold a substrate, have several advantages over mechanical and vacuum chucks, including reduction of stress-related cracks caused by mechanical clamps; allowing utilization of a larger portion of the substrate surface; limiting deposition of corrosion particles on the substrate; and allowing use of the chuck in low pressure processes. A typical electrostatic chuck includes an electrically conductive electrode with an electrical insulator thereon. A voltage source electrically biases the substrate with respect to the electrode. The insulator prevents the flow of electrons therethrough, causing opposing electrostatic charge to accumulate in the substrate and in the electrode, thereby generating an electrostatic force that attracts and holds the substrate onto the chuck.

A typical electrostatic chuck comprises a metal electrode covered by a thin polymeric insulator layer. The thin polymer layer maximizes electrostatic attractive forces between the substrate and the electrode. However, when the substrate held on the chuck breaks or chips to form fragments having sharp edges, the substrate fragments puncture the polymer film exposing the electrode of the chuck, particularly when the polymer is soft and has low puncture resistance at high processing temperatures. Exposure of the electrode at even a single pinhole in the insulator can cause arcing between the electrode and plasma, and require replacement of the entire chuck. Polymer insulators also have a limited lifetime in erosive process environments, such as processes using oxygen-containing gases and plasmas. In these processes, the insulator can be eroded by the erosive process gas and the resultant exposure of the electrode results in failure of the chuck during processing and loss of the entire substrate at a significant cost. It is also desirable for such polymeric insulator layers to provide sustained operation at elevated temperatures, preferably exceeding about 175° C., and more preferably exceeding 200° C.

In one solution for increasing the puncture and erosion resistance of the insulator, a hard ceramic layer is formed over the electrode. For example, commonly assigned EP 635 869 A1 discloses an electrostatic chuck that comprising a polymeric dielectric layer with a protective ceramic overcoat of $Al_2O_3$ or AlN. In another example, U.S. Pat. No. 5,280, 156 to Niori discloses a ceramic dielectric layer covering an electrode of an electrostatic chuck. In yet another example, U.S. Pat. No. 4,480,284 discloses a ceramic layer made by flame spraying $Al_2O_3$, $TiO_2$, $BaTiO_3$, or a mixture of these materials over an electrode, and impregnating the pores of the ceramic dielectric with a polymer. However, there are several problems with these ceramic structures. One problem with ceramic overlayers is that the volume resistivity of ceramic layers generally decreases to values less than $10^{11}$ $\Omega$cm with increasing temperature resulting in unacceptable current leakage from the electrodes of the chuck at high temperatures. Another problem is that the ceramic and polymer layers often delaminate from one another, particularly when the thermal expansion coefficients of the layers is mismatched.

Yet another problem with the hard ceramic layers occurs because it is often necessary to cool the substrate when the substrate is being processed in plasma processes. Bombardment by high energy plasma ions cause heat buildup and thermal damage to the substrate and chuck. Conventional chucks utilize cooling systems which hold coolant between the substrate and the insulator of the chuck to cool the substrate. However, it is difficult to form a seal between the hard ceramic coatings and the peripheral edge of the substrate causing coolant to leak from the grooves of the chuck, and resulting in non-uniform temperatures across the substrate. Also, it is difficult to machine the ceramic layers to form coolant holding grooves or coolant inlet apertures that do not have rough edges and corners. The rough edged grooves easily scratch and damage the substrate held on the chuck. Furthermore, such cooling systems can be inefficient when used on ceramic chucks because the highly thermally insulative ceramic insulator can impede the transfer of heat from the substrate to the chuck.

Thus, it is desirable to have electrostatic chuck that is resistant to failure from puncturing by sharp fragments and particles, and from failure by erosion in erosive process environments. There is also a need for an electrostatic chuck that is capable of sustained operation at elevated temperatures, preferably exceeding about 200° C. It is also desirable to have a chuck which allows coolant to directly contact the substrate, without causing excessive coolant leakage from the periphery of the chuck. There is a further need for a fabrication process for providing a thin insulator that maximizes electrostatic attractive force, a strong bonding of the insulator to the electrode, and a conformal insulator layer with smooth edged coolant grooves and apertures.

SUMMARY

The present invention is directed to a puncture resistant electrostatic chuck useful for holding a substrate in a process environment containing sharp fragments and particles, and capable of providing excellent thermal transfer rates between the substrate and the chuck. One version of the puncture resistant electrostatic chuck comprises at least one electrode and a composite insulator covering the electrode. The composite insulator comprises (i) a matrix material having a conformal holding surface capable of conforming to the substrate under application of an electrostatic force generated by the electrode to reduce leakage of heat transfer fluid held between the substrate and the holding surface, and (ii) at least one layer of fibers in the matrix material, the layer of fibers positioned below the holding surface, and being sufficiently hard to increase the puncture resistance of the insulator. Preferably, the matrix material comprises a polyimide matrix, and the layer of fibers comprises a layer of aromatic polyamide fibers in the polyimide matrix.

In another version, the chuck comprises an insulator covering at least one electrode. The insulator comprises a substantially planar, conformal, and resilient holding surface capable of conforming to the substrate under application of an electrostatic force generated by the electrostatic member to form a seal along the peripheral edge of the substrate, thereby reducing leakage of heat transfer gas held between the substrate and the holding surface. A hard aromatic polyamide layer below the holding surface covers substantially the entire electrode, and is sufficiently hard to increase the puncture resistance of the insulator.

In a preferred embodiment, the chuck comprises a composite insulator covering at least one electrode, the composite insulator comprising (i) a polyimide layer having a substantially planar and conformal holding surface capable of conforming to a substrate electrostatically held on the chuck to reduce leakage of heat transfer fluid held between the substrate and the holding surface; and (ii) an aromatic polyamide fiber layer sufficiently hard to increase the puncture resistance of the composite insulator. Preferably, the aromatic polyamide fiber layer is intermeshed to increase the puncture resistance of the composite insulator. More preferably, the aromatic polyamide fiber layer is positioned below the polyimide layer, and comprises (i) non-woven randomly oriented fibers, or (ii) woven and oriented fibers. Most preferably, the aromatic polyamide fibers comprise aramid fibers.

A method of forming the puncture-resistant electrostatic chuck comprises the step of forming a multilayer composite insulator comprising one or more electrodes, and a composite insulator covering the electrodes. The composite insulator comprises (i) a conformal holding surface capable of conforming to the substrate under application of an electrostatic force generated by the electrode to reduce leakage of heat transfer gas held between the substrate and the holding surface, and (ii) a layer of fibers positioned below the holding surface, the layer of fibers being sufficiently hard to increase the puncture resistance of the insulator. The composite insulator is positioned and adhered to the base.

In another method of fabricating the chuck, a multilayer composite insulator having precut heat transfer fluid grooves is formed by the steps of (1) forming a first insulator layer having an electrode thereon, (2) cutting a pattern of first grooves in a fiber layer to form a precut fiber layer, (3) placing the precut fiber layer over the electrode of the first insulator layer; and (4) positioning a second insulator layer on the precut fiber layer, and (5) cutting second grooves through the second insulator layer, the first and second grooves being substantially being aligned to one another to form the heat transfer fluid grooves. The multilayer composite insulator is adhered to a base to form the puncture resistant electrostatic chuck.

In yet another fabrication method, a puncture-resistant electrostatic chuck is formed by the step of forming a laminate comprising (i) a lower polymer layer having an electrode thereon, (ii) an intermediate fiber layer covering the electrode; and (iii) an upper polymer layer over the fiber layer. Grooves are cut through the laminate to form a precut laminate comprising a pattern of grooves sized and distributed to hold heat transfer fluid therein. The precut laminate is positioned on a base and a pressure applied on the laminate to adhere the laminate to the chuck.

DRAWINGS

The features, aspects, and advantages of the present invention will become better understood with regard to the following description, appended claims, and accompanying drawings which illustrate versions of the invention, where:

FIGS. 4a—4d are sectional schematic side views showing successive steps in the fabrication of an embodiment of the electrostatic chuck of the present invention; and FIG. 5 is a sectional schematic side view of a vacuum bag lay-up in a pressure forming apparatus.

DESCRIPTION

Figure 1:
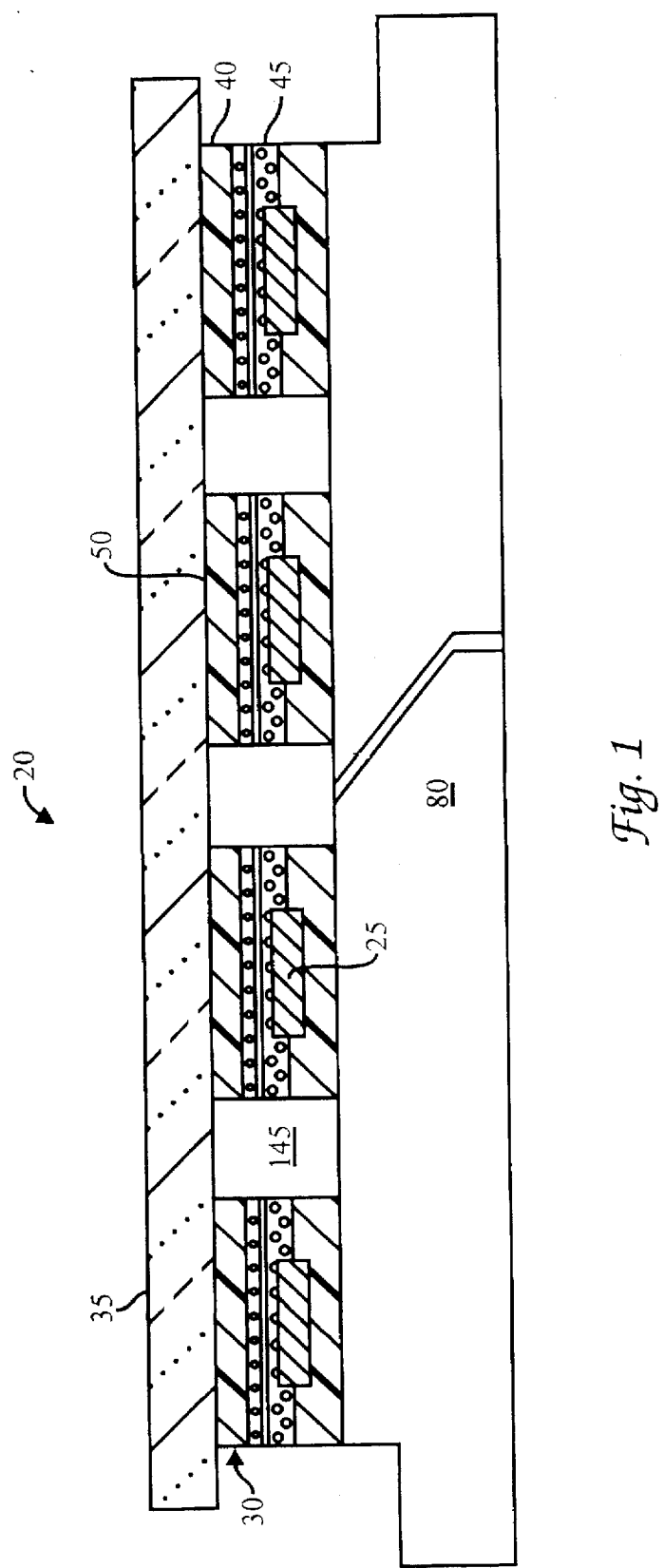
FIG. 1 is a partial sectional schematic side view of an embodiment of the electrostatic chuck of the present invention.

The electrostatic chuck of the present invention is useful for holding, and for regulating the temperature of, substrates in process environments containing sharp edged wafer fragments and metal particles that can puncture the insulator on the chuck. As schematically illustrated in FIG. 1, an electrostatic chuck 20 of the present invention comprises one or more electrodes 25 covered by a layer of insulator 30. The electrodes 25 are capable of electrostatically holding a substrate 35 when a voltage is applied to the electrodes, as described below. The insulator 30 covers the electrodes 25 to electrically insulate the electrodes from the process environment. The insulator 30 is a composite layer comprising (i) a resilient and conformal layer 40 capable of conforming to the substrate 35 electrostatically held on the chuck 20 upon application of a voltage to the electrode 25, and (ii) a hard puncture resistant layer 45 that is sufficiently hard to increase the puncture resistance of the insulator layer. The resilient and conformal layer 40 comprises a planar and conformal holding surface 50 that is provided to reduce leakage of a heat transfer fluid held between the substrate 35 and the conformal layer. The resilient layer 40 provides a cushioning surface that allows at least a portion of the perimeter of the substrate 35 to form a seal with the holding surface 50 that reduces leakage of heat transfer fluid held below the substrate 35. The composite insulator 30 further comprises a hard puncture resistant layer 45 that is sufficiently hard to protect the composite insulator 30 from rupturing on contact with a sharp edged particle, such as a wafer fragment or a metal particle, as described below. The combination of the conformal layer 40 and the hard layer 45 provides the desired combination of puncture resistance properties and effective sealing and containment of heat transfer fluid held below the substrate 35.

In the version shown in FIG. 1, the composite insulator 30 comprises a matrix material having a conformal holding surface 50 capable of conforming to the substrate 35 under application of an electrostatic force generated by the electrode 25 to reduce leakage of heat transfer gas held between the substrate and the holding surface. Preferably, the matrix material comprises a resilient polymer capable of withstanding operating temperatures exceeding 200° C., such as for example, a polyimide matrix. At least one hard puncture resistant layer of fibers 45 is positioned below the holding surface 50 of the matrix material. The layer of fibers 45 is sufficiently hard to increase the puncture resistance of the composite insulator 30 so that sharp fragments and debris do not penetrate the insulator layer, thereby protecting the electrode 25 from shorting in the process environment. Preferably, the layer of fibers 45 comprises a layer of aromatic polyamide fibers in the polyimide matrix, which provide the desired hardness and fracture toughness. Suitable aromatic polyimide fibers include aramid fibers 45.

Figure 2:
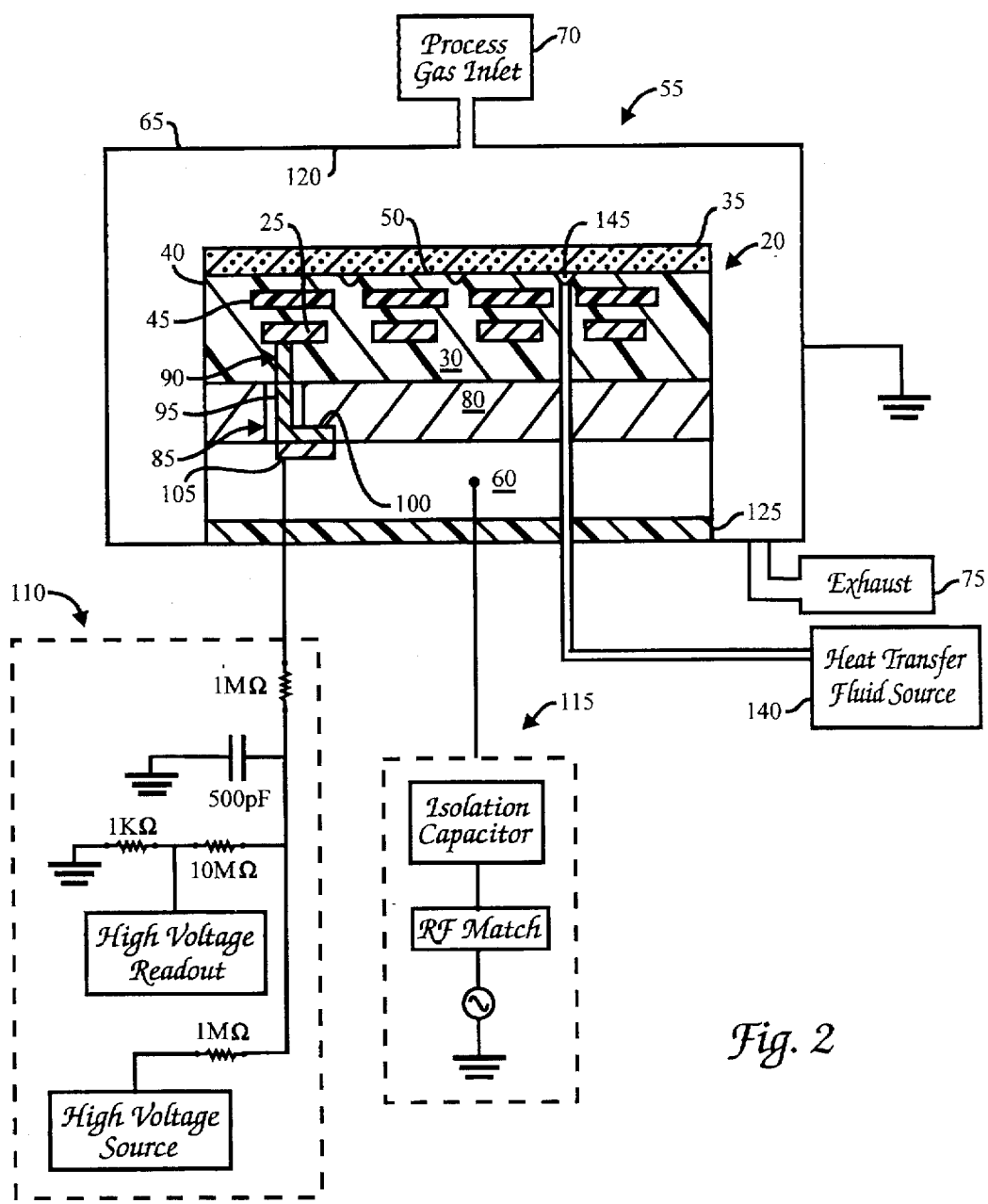
FIG. 2 is a partial sectional schematic side view of a process chamber showing operation of an embodiment of the chuck of the present invention.
Figure 3:
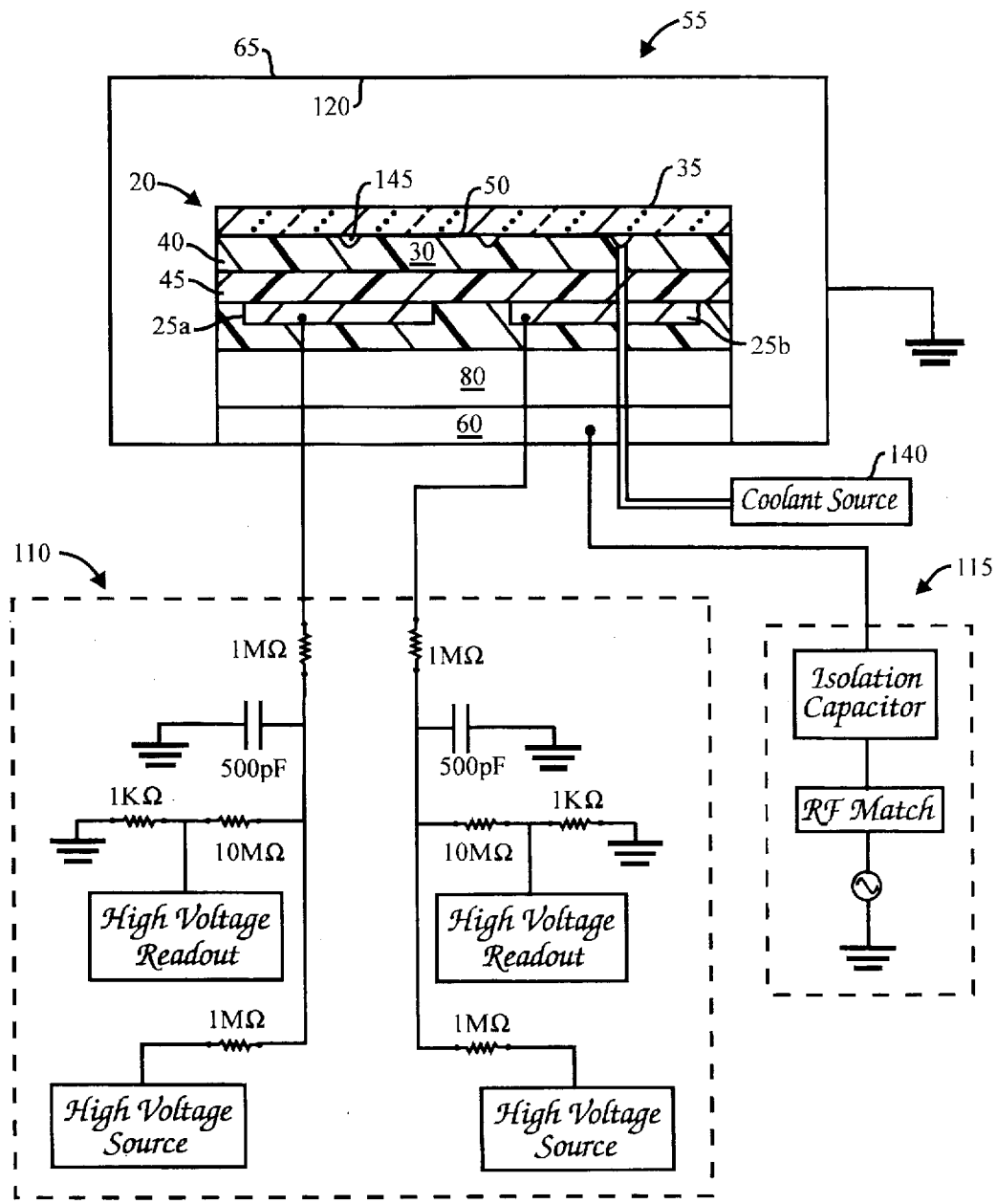
FIG. 3 is a partial sectional schematic side view of a process chamber showing operation of another embodiment of the electrostatic chuck of the present invention.

Operation of an electrostatic chuck 20 according to the present invention in a semiconductor processing apparatus 55, as schematically illustrated in FIGS. 2 and 3, will now be described. Although operation of the invention is illustrated in context to the apparatus 55, the invention can also be used in other substrate processing apparatus as apparent to those skilled in the art, and should not be limited to the apparatus described herein. For example, the apparatus 55 can represent a "PRECISION 5000" magnetically enhanced reactive ion etching apparatus, or a physical vapor or chemical deposition apparatus, which are commercially available from Applied Materials, Inc., Santa Clara, Calif. As illustrated in FIG. 2, the electrostatic chuck 20 is secured on a support 60 in a process chamber 65 that forms an enclosure for processing of the substrate 35. The process chamber 65 typically includes a process gas source 70 for introducing process gas into the chamber, and a throttled exhaust 75 for exhausting gaseous byproducts from the chamber. The particular embodiment of the process chamber 65 shown in FIG. 2 is suitable for plasma processing of substrates 35; however, the present invention can be used with other process chambers or processes without deviating from the scope of the invention.

Typically, the electrostatic chuck 20 further comprises a base 80, with a bore 85 therethrough. The base 80 is useful for supporting the electrodes 25 and composite insulator 30. An electrical connector 90 electrically connects the electrode 25 to a voltage supply. The electrical connector 90 comprises (i) an electrical lead 95 that extends through the bore 85 of the base 80, and (ii) an electrical contact 100 that electrically engages a voltage supply terminal 105 at the interface between the base and the support 60. A first voltage supply 110 provides an electrical voltage to the voltage supply terminal 105 for operating the chuck 20. The first voltage supply 110 typically includes a circuit which comprises (i) a high voltage DC source of about 1000 to 3000 volts, connected to a high voltage readout through a 10 MΩ resistor, (ii) a 1 MΩ resistor in the circuit limits current flowing through the circuit, and (iii) a 500 pF capacitor that serves as an alternating current filter. A second voltage supply 115 is connected to the support 60 in the process chamber 65. At least a portion of the support 60 is typically electrically conductive and functions as a process electrode 25, typically a cathode, for forming a plasma in the chamber 65. The second voltage supply 115 electrically biases the support 60 with respect to an electrically grounded surface 120 in the chamber 65 to form an electric field that generates and/or energizes a plasma formed from the process gas in the chamber 65. An insulative flange 125 is disposed between the support 60 and the grounded surface 120 to electrically isolate the support from the grounded surface. The second voltage supply 115 generally comprises an RF impedance that matches the impedance of the process chamber 65 to the impedance of the line voltage, in series with an isolation capacitor.

To operate the chuck 20, the process chamber 65 is evacuated and maintained at a sub-atmospheric pressure. A substrate 35 is placed on the chuck 20, and the electrodes 25 of the chuck 20 are electrically biased with respect to the substrate 35 by the first voltage supply 110. Thereafter, process gas is introduced into the chamber 65 via the gas inlet 70, and plasma is formed from the process gas by activating the second voltage supply 115 or by using alternative plasma generator sources, such as inductor coils (not shown) or a microwave source (also not shown). The voltage applied to the electrodes 25 causes electrostatic charge to accumulate in the electrodes, and the plasma in the chamber 65 provides electrically charged species having opposing polarity which accumulate in the substrate 35. The accumulated opposing electrostatic charge results in an attractive electrostatic force that electrostatically holds the substrate 35 to the chuck 20.

An alternative version of the chuck 20 comprising bipolar electrodes 25 is illustrated in FIG. 3. In this version, the composite insulator 30 covers a plurality of electrodes 25a, 25b sized and configured to serve as bipolar electrodes. In the bipolar version, the first voltage supply 110 provides a differential electrical voltage to the electrodes 25a, 25b. In a preferred configuration, the first voltage supply 110 comprises two power supplies that provide a negative voltage to the first electrodes 25a, and a positive voltage to the second electrodes 25b, to maintain the electrodes at a differential electric potential relative to one another. The opposing electric potentials of the electrodes 25a, 25b induce opposing electrostatic charges in the electrodes and substrate 35 causing the substrate to be electrostatically held to the chuck 20. Bipolar electrode configurations are advantageous for non-plasma processes in which there are no charged plasma species to serve as charge carriers for electrically biasing the substrate 35.

To regulate the temperature of the substrate 35 held on the chuck 20, a heat transfer fluid or coolant source 140 is used to supply heat transfer fluid to grooves 145 in the composite insulator 30. The substrate 35 electrostatically held on the chuck 20 presses against the conformal holding surface 50 of the composite insulator 30, sealing the periphery of the grooves 145 to prevent heat transfer fluid from leaking out from below the substrate. The heat transfer fluid in the grooves 145 can be used to heat or cool the substrate 35 to regulate the temperature of the substrate, or to maintain the substrate at constant temperatures during processing. Typically, the grooves 145 form a pattern of intersecting channels extending partially or entirely through the composite insulator 30. Typically, on a microscopic level, only a small portion of the substrate 35 actually contacts the conformal holding surface 50 of the insulator 30. Heat transfer fluid below the substrate 35 flows into the microscopic gap between the substrate and the holding surface 50 to provide enhanced thermal coupling and heat transfer by gas conduction between the substrate 35 and the holding surface 50. Thus, preferably, the holding surface 50 is sufficiently soft, conformal, and resilient to provide a seal having substantially no gaps along the outer periphery 110 of the holding surface, thereby allowing substantially no heat transfer fluid to leak out, or erosive process gas to access the portions of the insulator 30 below the substrate and adjacent to the electrode 25.

The heat transfer fluid can be any liquid or gas capable of transferring heat to the substrate 35, or removing heat from the substrate. The heat transfer fluid can be used to cool or heat the substrate 35 to achieve uniform temperatures on the substrate. When cooling of the substrate 35 is needed, the chuck 20 is maintained at a lower temperature than the substrate, so that the heat transfer fluid can transfer heat from the substrate to the chuck. Alternatively, when the substrate 35 is heated, the chuck 20 is maintained at a higher temperature than the substrate, so that the heat transfer fluid can transfer heat to the substrate. Preferably, the heat transfer fluid comprises a non-reactive gas that is substantially non-reactive to the process environment in the process chamber 65 so that leaking heat transfer fluid does not adversely affect the processes performed on the substrate 35. The non-reactive gas should also be non-reactive to the materials used to fabricate the chuck 20, and in particular, to the conformal holding surface 50 which is in contact with the non-reactive gas. For example, when polymeric materials such as polyimide are used to fabricate the conformal holding surface 50, reactive gases that erode polyimide, such as oxygen, should be avoided. Preferably, the heat transfer fluid has an elevated thermal conductivity to provide optimal thermal transfer rates between the substrate 35 and the chuck 20. Preferred heat transfer fluids that are non-reactive to the process environment and holding surface 50, and that have elevated thermal conductivity comprise helium, argon, nitrogen and the like. The thermal conductivity at about room temperature of argon is about $43 \times 10^{-6}$, nitrogen is about $62 \times 10^{-6}$, and helium is about $360 \times 10^{-6}$ in cal/(sec)(cm$^2$)(°C./cm). Thus, by elevated thermal conductivity, it is meant a room temperature thermal conductivity of about 40 to about 360 cal/(sec)(cm$^2$)(°C./cm).

The composite insulator 30 comprises a resilient and conformal holding surface 50 that is substantially planar across the entire surface of the chuck 20. The conformal holding surface 50 conforms to the substrate 35 under the applied electrostatic force to form a seal at the peripheral edge of the chuck 20 that reduces leakage of heat transfer fluid from below the periphery of the substrate 35. The seal formed by the holding surface 50 also provides a barrier that widely separates the electrode 25 from the surrounding erosive process environment.

The conformal holding surface 50 is preferably the surface of an electrically insulative polymeric material, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber. A preferred material to form the conformal holding surface 50 comprises a layer of polyimide. Polyimide is resilient enough to deform slightly under the electrostatic clamping pressure to provide enhanced heat transfer when a heat transfer fluid is introduced in the microscopic gap between the substrate 35 and the resilient polyimide layer. Polyimide also provides superior temperature resistance and excellent dielectric properties. For example, polyimide has a high dielectric breakdown strength, ranging from 5,000 to 10,000 volts per mil, which allows use of a thin layer that maximizes the electrostatic attractive force. Polyimides are also resistant to temperatures in excess of 100° C., and more preferably in excess of 200° C., allowing use of the chuck 20 for high temperature processes. Preferably, the polymeric material also has a high thermal conductivity so that heat generated in the substrate 35 during processing can dissipate through the chuck 20, a suitable thermal conductivity being at least about 0.10 Watts/m/°K.

The composite insulator layer 30 of the present chuck 20 performs another function besides providing a conformal surface for the purposes of sealing in the heat transfer fluid. In this function, the hard puncture resistant layer 45 of the composite insulator 30 provides excellent resistance to puncturing by sharp-edged fragments or particles in the process environment. During processing, the substrates 35 held on the chuck 20 can chip to form fragments having sharp edges. The sharp-edged fragments puncture the surface layer of the chuck 20, particularly when a soft polymer film is used to form the holding surface 50. Exposure of the electrode 25 at even a single pinhole in the insulator 30 can cause arcing between the electrode and plasma, and require replacement of the entire chuck 20. The hard puncture resistant layer 45 within the composite layer prevents penetration of such fragments, by providing a barrier between the electrode 25 and the external process environment. In this manner, the hard layer 45 prevents catastrophic failure and rupturing of the insulator 30 covering the electrode 25.

The hard puncture resistant layer 45 in the composite insulator 30 preferably comprises a polymer having a tensile strength, tenacity, hardness, stiffness, and fracture toughness (relative to other polymers). The tensile strength is preferably at least about $80 \times 10^3$ psi, and more preferably at least about $200 \times 10^3$ psi. The tenacity and stiffness of the layer results in reduced penetration or puncture of the insulator by sharp edged particles. The tenacity (dry) is preferably at least about 10 g/denier, and more preferably at least about 20 g/denier. The stiffness is preferably at least about 100 g/denier, and more preferably at least about 600 g/denier. In addition, it is preferred that the puncture resistant layer comprises an elevated fracture toughness of at least about 0.79 g-cm, and more preferably at least about 1.0 g-cm. In contrast, conventional polymers have tensile strengths of about $10 \times 10^3$ to $100 \times 10$ psi, dry tenacity of 0.5 to 8 g/denier, and stiffness of 2 to 30 g/denier, which are considerably lower than those used in the present invention. It should be understood that the hardness, flexural fatigue resistance, and impact strength are a function of the degree of crystallinity and molecular weight of the hard polymer, as described in *Textbook of Polymer Science, 3rd Ed.*, by F. W. Billmeyer, Jr., John Wiley & Sons (New York 1984), which is incorporated herein by reference. It has been discovered that a preferred material that provides a high hardness, stiffness, tenacity and toughness values, excellent chemical compatibility, and strong adhesion with polymeric materials is a polyamide material comprising a high molecular weight polymer having hydrocarbon chains containing amide or —CONH— molecular groups. More preferably, the puncture resistant layer 45 comprises highly aromatic polyamides that exhibit increased puncture resistance because of their higher hardness as compared with conventional polyamide materials. The highly aromatic polyamides can be in the form of a continuous or segmented planar layer disposed directly above and covering the electrodes 25 (as shown in FIGS. 2 and 3); or in the form of a layer of intermeshed fibers covering the electrodes 25 (as shown in FIGS. 1 and 4). Most preferably, the highly aromatic polyamides comprise aramid materials. The puncture resistant layer can be in the form of a sheet of aramid, or a layer of aramid fibers. The aramid sheet and/or fibers comprise highly aromatic polyamide chains that are preferably oriented parallel to the plane of the sheet, or to the longitudinal axis of the fiber. The highly aromatic molecular chains of aramid provide a hard polymer that exhibits excellent puncture resistance. Preferably, the aramid sheet, or layer of fibers, comprise KEVLAR® or NOMEX®, aramid materials fabricated by DuPont de Nemours Company, Wilmington, Del. For example, Kevlar typically has a tensile strength of $400 \times 10^3$ psi, a dry tenacity of 22 g/denier, a percent elongation at break of 2.5%, and a stiffness of 975 g/denier. Nomex has a tensile strength of $90 \times 10^3$ psi, a dry tenacity of 4–5.3 g/denier, and a toughness of 0.85 g-cm. Aramid materials are typically derived from phenylenediamine and terepthaloyl chloride.

Different versions of the chuck 20 that provide easy fabrication, increased reliability, and/or maximization of the electrostatic clamping force generated by the electrodes 25 will now be described. In the version illustrated in FIG. 2, the hard puncture resistant layer 45 comprises a discontinuous sheet of aromatic polyamide comprising protective, substantially planar, barrier segments or platelets covering each of the electrode 25 segments. Each barrier segment is sized larger than a corresponding electrode segment 25 and positioned parallel to and directly above the electrode segment, to provide a covering for substantially the entire electrode segment.

In the alternative version shown in FIG. 3, the hard puncture resistant layer 45 comprises a continuous sheet of aromatic polyamide that covers the entire surface of the electrode 25 embedded in the composite insulator 30. The sheet of aromatic polyamide can comprise a solid and homogeneous sheet that is parallel to, spaced apart, and covering the electrode 25.

In the preferred version, shown in FIGS. 1 and 4, the aromatic polyamide layer 45 comprises an intermeshed layer of fibers such as a paper, felt, cloth, or woven structure. It has been discovered that the intermeshed fiber-containing layer provides increased hardness, fracture toughness, and puncture resistance. The fiber-containing layer can be a paper or felt structure comprising non-woven, randomly oriented, short fibers or whiskers which comprise fibers of polyamide embedded in a polymer matrix. When the aromatic polyamide is present in the form of fibers, a surrounding matrix material is used to hold the fibers together. Preferably, the matrix material provides good adhesion and chemical compatibility between the material comprising the conformal holding surface 50 and the aromatic polyamide fibers.

In a preferred configuration, as shown in FIG. 4d, the aramid fibers form a paper or felt structure is easier to fabricate into the chuck 20 because it is easier to cut or laser ablate this randomly oriented structure. Alternatively, the aramid fibers can comprise an oriented woven structure, such as cloth or a weave pattern. A suitable cloth is a "THERMOUNT®" cloth fabricated by DuPont de Nemours Company, Wilmington, Del., having a yarn of 40–60, a denier of 40–60, a fill of 50–60, and a warp of 60–80. While the oriented woven structure is difficult to cut, the woven structure provides more predictable properties in the plane parallel to the fibers, due to the predetermined non-random orientation of the fibers.

Most preferably, the aramid fibers are embedded in, or impregnated with, a partially cured polymer matrix, such as B-staged polyimide, which increases adhesion of the polyamide fibers to the overlying or underlying polyimide structure. The fibers typically comprise about 10 to 50 volume percent, and the matrix comprises the balance of the composite material. By partially cured it is meant that the matrix is partially cross-linked by heating to a temperature lower than the curing temperature. The partially cross-linked polymer contains active functional groups that can chemically bond to the functional groups of the polyimide or other polymer layers used to form the composite insulator, providing strong interlaminar adhesion. The adhesion between the soft polyimide layer and the hard aramid layer is maximized, and thermal expansion mismatch reduced, by selecting a matrix material for the aramid fibers which is similar in properties to the polyimide layer. Thus, preferably, the polymer matrix comprises polyimide partially cured (β-staged) to a gelled fluidity equivalent to 30–40% flow so that the polyimide matrix can easily adhere to the underlying and/or overlying polyimide layers.

A suitable aramid fiber and polymer matrix material is "ARLON 85NT®," commercially available from Arlon, Rancho Cucamonga, Calif.; which comprises non-woven, randomly oriented, aramid fibers in a 47 vol % polyimide matrix. The coefficient of thermal expansion along the plane of fibers is from 8–12 ppm, its dielectric constant at 1 MHZ is about 3.9, and its glass transition temperature Tg is about 250° C. Another useful aramid fiber composite matrix is "NOMEX 410®," fabricated by DuPont de Nemours Chemical Company. NOMEX 410 has a thickness of about 50 to 125 μm, a dielectric breakdown strength of about 17 to 25 kV/mm, and a dielectric constant at 60 Hz of 1.6 to 2.4. NOMEX 410 exhibits enhanced plasma resistance and is useful at temperatures exceeding below 260° C. Yet another aramid fiber matrix composite is "THERMOUNT," commercially available from DuPont de Nemours Chemical Company, which comprises non-woven aramid fibers in a polyimide matrix having a dielectric constant at 1 MHZ of 3 to 3.9.

The different components of the chuck 20 and illustrative methods of fabricating the chuck will now be described; however, other methods of fabrication can be used to form the chuck and the present invention should not be limited to the illustrative methods described herein.

The base 80 of the chuck 20 that is used to support the electrode 25 and insulator 30, is typically shaped and sized to correspond to the shape and size of the substrate 35 to maximize heat transfer and provide a wide holding surface 50. For example, if the substrate 35 is disk shaped, a right cylindrically shaped base 80 is preferred. Typically, the base 80 is made of aluminum and has a right cylindrical shape with a diameter of about 100 mm to 225 mm, and a thickness of about 1.5 cm to 2 cm. The top and bottom surfaces of the plate are ground using conventional grinding techniques, until the surface roughness of the plate is less than 1 μm, so that the base 80 can uniformly contact the support 60 and the substrate 35 to allow efficient thermal transfer therebetween. The base 80 also has bores 85 sized sufficiently large to insert the electrical connector 90 therethrough.

The electrodes 25 are made from an electrically conductive material, such as for example, metals such as copper, nickel, chromium, aluminum, and alloys thereof. Typically, the thickness of the electrodes 25 is from about 1 μm to about 100 μm, and more typically from 1 μm to 50 μm. Preferably, each electrode 25 comprises a contact area of from about $10^{-4}$ to $10^{-1}$ times the area of the substrate 35. For a substrate 35 having a diameter of 200 to 300 mm (6 to 8 inches), preferably each electrode 25 comprises a contact area of at least about 20 sq mm, and more preferably from about 50 to about 1000 sq mm. The shape and size of the area covered by the electrodes 25 varies according to the size and shape of the substrate 35. For example, if the substrate 35 is disk shaped, the electrodes 25 are also arranged in a disk shaped configuration to maximize the total area of the electrode below the substrate 35. Preferably, the electrodes 25 cover a total area of about 50 to about 500 sq cm, and more typically from 80 to 380 sq cm.

For the bipolar electrode configuration shown in FIG. 3., the contact areas of each electrode 25a, 25b are substantially equivalent and coplanar to one another, so that the electrodes generate equivalent electrostatic clamping forces on the substrate 35. Typically, the contact area of each electrode 25a, 25b is from about 50 to about 250 sq cm, and more preferably from about 100 to 200 sq cm. The first and second electrodes 25a, 25b can comprise opposing semicircular plates. Alternatively, the first electrodes 25a can comprise at least one inner ring of electrodes, and the second group of electrode 25b can comprise at least one coencentric outer ring of electrodes, circumferentially disposed about the inner electrode ring. Electrical isolation voids electrically isolate the electrodes 25a, 25b from one another, and can be sized and configured to serve as grooves 145 for holding heat transfer fluid for regulating the temperature of the substrate 35 on the chuck 20.

Electrical connectors 90 are used to electrically connect the monopolar electrode 25, or the bipolar electrodes 25a, 25b, to the voltage supply 110. Each electrical connector 90 comprises an (i) electrical lead 95 that extends through the bore 85 in the base 80, and (ii) an electrical contact 100, as shown in FIG. 2. Typically, the length of the electrical lead 95 is from about 10 mm to about 50 mm, and the width of the electrical lead 95 is from about 2 mm to about 10 mm. Preferably, the electrical contact 100 is disk-shaped with an exposed area sized to directly contact and electrically engage a voltage supply terminal 105, the area preferably being from about 50 to about 400 sq mm.

The composite insulator 30 is preferably sized sufficiently large to cover and enclose all the electrodes 25 of the chuck 20. The bulk or volume resistivity of the insulator 30 should be (i) sufficiently low to allow rapid electrostatic charge accumulation and dissipation to provide a rapid response time, and (ii) sufficiently high to prevent leakage of the voltage applied to the electrodes 25 which can damage the devices formed on the substrate 35. Typically, the composite insulator 30 has a resistivity ranging from about $10^{11}$ Ωcm to $10^{20}$ Ωcm, and a dielectric constant of at least about 3, and more preferably at least about 4. A suitable thickness for the composite insulator 30 depends on the electrical resistivity and dielectric constant of the insulator. For example, when the composite insulator 30 has a bulk dielectric constant of about 3.5 (i.e, the combined dielectric constant of both the polyimide and the aromatic polyamide layers), the thickness of the insulator is typically about 10 μm to about 500 μm, and more typically from about 100 μm to about 300 μm. Suitable composite insulators 30 have bulk dielectric breakdown strengths of typically at least about 3.9 volts/micron (100 volts/mil), and more typically at least about 39 volts/ micron (1000 volts/mil).

Preferably, the composite insulator 30 is fabricated as a laminate structure including (i) a first lower electrically insulative polymer layer 32 on which the electrodes 25 are formed, (ii) a hard aromatic polyamide layer 45 on the electrodes, and (ii) a conformal and resilient polymer layer 40 over the hard aromatic polyamide layer, as shown in FIG. 4d. Preferably, the conformal polymer layer 45 and aromatic polyamide layers 30b each comprise a thicknesses ranging from about 5 μm to about 250 μm, and more preferably from about 10 μm to about 100 μm. The polyimide layer 40 can be formed by spin coating a liquid polyimide precursor, or bonding of a polyimide film sheet, over the aromatic polyamide layer 45.

In a preferred method of manufacturing the electrostatic chuck 20, the electrode 25 embedded in the composite insulator 30 is fabricated as a unitary and multilayer laminate member comprising multiple layers of electrical insulator and conductive electrode 25 layer, as shown in FIGS. 4a–4d. An electrode 25 is formed on a first lower insulator 32 by electroplating or physical vapor deposition of a metal layer on the insulator film. Suitable first insulator layers 32 comprise commercially available polymer films such as "KAPTON," a polyimide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; or "SUPERIOR FILM" fabricated by Mitsubishi Plastics Indus. Ltd., Japan.

When the electrode 25 forms a patterned set of interconnecting lines with heat transfer fluid grooves 145 therebetween, a patterned photoresist layer 150, such as "RISTON" fabricated by DuPont de Nemours Chemical Co, is formed on the insulator layer 32 using conventional photolithographic methods, such as those described in *Silicon Processing for the VLSI Era, Volume 1: Process Technology*, Chapters 12, 13, and 14, by Stanley Wolf and Richard N. Tauber, Lattice Press, California (1986), which is incorporated herein by reference. The resist layer 150 is patterned to correspond to the shape of the electrodes 25 as shown in FIG. 4a. Thereafter, electroplating or sputtering is used to deposit segmented electrodes 25 between the resist pattern, to a thickness of about 2 μm to 100 μm, and more preferably about 5 μm, on the first insulator layer 32, as shown in FIG. 4b. For example, a copper electrode can be sputtered layer on the insulator film 32 with a chromium oxide bonding layer therebetween. Sputtering allows deposition of thinner electrode layers. After depositing the electrode layer 25, residual photoresist is stripped from the composite layer using a conventional acid or oxygen plasma stripping process, and optionally bottom grooves 165 can be formed in the first insulator layer 32 between the electrode segments.

Thereafter, an aromatic polyamide layer, such as an aramid fiber layer 45 in a partially staged polyimide matrix, such as a ARLON 85NT, NOMEX 410 or THERMOUNT, is cut to form a pattern of first grooves 170 therethrough. It has been discovered that the hard aramid fiber layer 45 is difficult to cut to form the desired groove pattern because the plaint fibers bend or fold-over during cutting to form frayed edges that interfere with fabrication of the chuck 20. Thus, the aramid fiber layer 45 in the partially cross-linked matrix is precut to form the first grooves 170 before assembling the different layers together. The aramid fiber layer 45 can be cut by punching, stamping, pressing, or laser ablating the fiber layer to form the predetermined pattern of first grooves 170. After the first grooves 170 are cut, the aramid layer 45 is aligned with bottom grooves 165 on the first insulator layer 32 to form an intermediate fiber layer covering the electrode of the first insulator layer, as shown in FIG. 4c. Multiple layers or plies of the aramid can be used to increase the thickness of the composite. Thereafter, an upper second insulator layer 40, such as a polyimide layer that forms the upper conformal holding surface 50 of the chuck 20, is positioned onto the laminate. At this stage, or after laminating the layers together as described below, a second cutting step is performed to cut through the second insulator layer 40. Thereafter, the laminate is heat treated or pressure treated to form a unitary electrostatic member comprising a multilayer composite insulator 30 with an electrode 25 embedded therein. Because the aramid fiber layer 45 is precut before assembly of the laminate, the formation of fiber strands and/or rough uncut edges in the aramid layer is substantially reduced. This provides a composite insulator structure 30 having excellent puncture resistance and conformal surface properties.

The electrical connector 90 of the electrostatic chuck 20 is typically formed as an integral extension of the electrodes 25 by stamping, punching, or pressing out the electrical connector from the laminate composite insulator. Preferably, the electrical connector 90 is cut out so that the electrical lead 95 and contact 100 are disposed within one of the grooves 145. After cutting out the electrical connector 90, the insulator 30 on the electrical connector is removed to expose the underlying electrically conductor layer which forms the electrical contact 100. The electrical lead 95 and electrical contact 100 are inserted through the bore 85 in the base 80 so that the electrical contact is disposed below the base as shown in FIG. 2. The laminate insulator structure can be then adhered to the base 80 of the chuck, using conventional adhesives, such as (i) thermally activated adhesives which are non-tacky at room temperatures and tacky at elevated temperatures, or (ii) pressure sensitive adhesives which are tacky under pressure. Suitable adhesives include for example acrylics such as methacrylate, polyesters, polyamides, polyurethanes, epoxies, silicone containing adhesives, and mixtures thereof.

A preferred method for conforming and adhering the composite insulator 30 to the base 80 uses a pressure forming process. In this method, the composite insulator 30 with the electrode 25 therein is placed on the base 80 to form a base insulator assembly 155, as shown in FIG. 5. The base insulator assembly 155 is then placed in a pressure forming apparatus 180 which is maintained at a pressure sufficiently high to force the composite insulator 30 to conform and bond to the upper surface 95 of the base 80. Typically, the pressure forming apparatus 180 is maintained at a pressure of about 10 to about 500 psi (500 to 30,000 Torr), and more typically about 200 psi (10,000 Torr). When the insulator film 30 is adhered to the base 80 using a pressure sensitive adhesive, lower pressures are preferred to avoid excessive squeezing out of the adhesive, the pressures typically ranging from about 10 to 25 psi (500 to 13,000 Torr). Preferably, a stainless steel plate (not shown) having a roughness less than about 0.2 to 0.3 microns RMS, is positioned on the insulator film 30 to apply a uniform and flat pressure on the laminate to provide a flat holding surface 50. Conventional pressure forming processes are generally described in Allen J. Kling, *Curing Techniques for Composites, Advanced Composites,* April, 1985, which is incorporated herein by reference.

Preferably, simultaneously with pressurization, the base insulator assembly 155 is heated to a temperature sufficiently high to cause the insulator film 30 to become malleable and flow into the surface roughness of the upper surface 95 of the base 80. A typical heating cycle comprises (i) a first temperature of about 120° C. for about 30 minutes to allow outgassing of gaseous reactant byproducts from the film, and (ii) a second temperature corresponding to the glass transition, or crystallization temperature of the insulator film 30 for about 60 minutes to cause the film 30 to become malleable and conform to the upper surface 95 of the base 80. When the film is adhered to the base 80 using a thermally activated adhesive, the temperature should be sufficiently high to activate the adhesive, typically at least about 300° C.

Suitable pressure forming apparatus 180 include autoclaves, platen presses or isostatic presses. The illustrated autoclave 180 is preferred because autoclaves apply a more uniform pressure on the base insulator assembly 155. Typical autoclaves comprise pressure resistant steel chambers having diameters ranging from about 1 to 10 feet, A pressurized nonreactive gases such as carbon dioxide or nitrogen is used to pressurize the autoclave. Suitable autoclaves include those fabricated by "BARON AUTOCLAVES," Santa Fe Springs, Calif.; "AOV INDUSTRIES" in Anaheim, Calif.; and "MELCO STEEL," in Azusa, Calif. Instead of using an autoclave, a platen press or isostatic press can also be used to conform the film to the base 80. When a platen press is used (not shown), a pressure-distribution sheet such as a silicone or stainless steel plate, is placed on the electrically insulator film 30 to uniformly distribute the platen pressure onto the base insulator assembly 155. Isostatic presses (not shown) are used by placing the base insulator assembly 155 in a suitable isostatic molding bag, and applying a sufficient pressure on the bag using the isostatic press.

Simultaneously with applying a pressure on the base insulator assembly 155, it is preferred to evacuate the air in the base insulator assembly 155 to remove air trapped between the insulator film 30 and the base 80, using a vacuum bag assembly 190. It is also desirable to remove trapped air to prevent oxidation of the electrode 25 in the composite insulator 30. The vacuum bag assembly 190 typically comprises a stainless steel base plate 195 which can be sealed using a flexible bagging material 200 as shown in FIG. 5. The bagging material 200 is typically made from nylon or silicone and is from about 25 to 100 µm thick. Vacuum bags manufactured by AIRTECH International Inc., Carson, Calif.; Bond Line Products, Norwalk, Calif.; and Zip-Vac, in Auburn, Wash., are suitable. To use the vacuum bag 160, the base insulator assembly 155 is placed within the vacuum bag 160, and layers of fabric and release film are stacked on the base insulator assembly 155 to form a vacuum bag assembly which allows gaseous reactant byproducts to be vented and also allows the base insulator assembly to be easily separated from the vacuum bag. A suitable series of fabrics and release films, as shown in FIG. 5, include: (i) release films 170a, 170b such as "TEFLON" (trademark) release film 170 fabricated by DuPont de Nemours Company, Wilmington, Del., and the "A4000P" release film fabricated by Airtech, Carson, Calif., placed on either side of the base insulator assembly 155; (ii) a pressure-distribution conformer sheet 205 such as a thermoplastic silicone sheet placed over the upper release film 170b to conform the insulator film 30 onto the base 80; (iii) a stack of porous bleeder fabrics 210 such as "AIRWEAVE SS RESIN ABSORBER" and the "AIRWEAVE FR EDGE BLEED," both fabricated by Airtech, Carson, Calif., placed on the conformer sheet 205 to promote evacuation of the vacuum bag 190 and to remove condensates formed in the process; and (iv) breather sheets 215 such as "AIRWEAVE SS RESIN ABSORBER" or "A22C" fabricated by Airtech, Carson, Calif., placed over the bleeder fabric 195 to provide uniform vacuum pressure around the bag 160. A tacky sealant tape 225 is used to seal the vacuum bag 190. The sealed vacuum bag 190 is evacuated via a vacuum connector line connected to a vacuum system (not shown), the vacuum line passing through the bag and terminating near the breather sheets.

In an alternative method of fabricating the composite insulator 30 with the electrode 25 therein, a commercially available multi-layer film comprising a first insulator layer having thereon an electrical conductor layer is used. Suitable multilayer films include "R/FLEX 1100" film fabricated by Rogers Corporation, Chandler, Ariz., comprising a 125 µm thick polyimide insulator layer and a 25 µm electrically conductive copper layer, "ABLESTIX" aluminum-filled polyimide film available from Ablestik Corporation; and "PARALUX" AP film, comprising polyimide directly bonded (without an adhesive) to rolled, annealed, or electrodeposited copper foil. The exposed portions of the electrode layer are etched using conventional wet or dry chemical etching methods to form the desired electrode pattern. A suitable wet chemical etching method comprises immersing the film into an etchant such as ferric chloride, sodium persulfate, or an acid or base, until the film is etched. Suitable dry etching processes are described in *Silicon Processing,* Chapter 16, supra, which is incorporated herein by reference. Thereafter, residual photoresist is stripped from the laminate, and an aromatic polyamide layer is then positioned over the etched electrical conductor layer to electrically insulate the electrode. Thereafter, a second insulator layer is adhered over the laminate structure, and grooves 145 are cut through the entire assembly by laser ablation, etched through at exposed portions between a patterned resist layer formed on the laminate, to avoid separation or fraying of the aromatic polyamide layer. The resultant precut laminate assembly is positioned on the base 80 of the chuck 20, and a pressure is applied on the laminate using the previously described pressure forming methods.

The electrostatic chuck 20 having features of the present invention has several advantages. First, the chuck 20 is resistant to failure from puncturing of the composite insulator 30 on the electrodes 25. The composite insulator 30 further comprises an aromatic polyamide layer 45 sufficiently hard to increase the puncture resistance of the composite insulator 30. It is the aromatic polyamide layer 45 that protects the composite insulator surface from rupturing on contact with a sharp edged particle, such as a wafer fragment or a metal particle, as described below. In addition, the planar and conformal holding surface 50 of the composite insulator layer 45 reduces leakage of heat transfer fluid held between the substrate 35 and the conformal holding surface 50. The resultant chuck 20 provides a unique combination of conformal surface layers and puncture resistant inner layers that provide an extended lifetime in processing environments.

Although the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. A puncture resistant electrostatic chuck having a holding surface for holding a substrate in a process environment, the chuck comprising:
   (a) at least one electrode; and
   (b) a composite insulator covering the electrode, the composite insulator comprising (i) a matrix material having a conformal holding surface capable of conforming to the substrate under application of an electrostatic force generated by the electrode to reduce leakage of heat transfer fluid held between the substrate and the holding surface, and (ii) at least one layer of fibers in the matrix material, the layer of fibers positioned below the holding surface, and the layer of fibers being sufficiently hard to increase the puncture resistance of the composite insulator.

2. The puncture resistant electrostatic chuck of claim 1, wherein the matrix material comprises polyimide.

3. The puncture resistant electrostatic chuck of claim 2, wherein the layer of fibers comprises a layer of aromatic polyamide fibers in the polyimide matrix.

4. The puncture resistant electrostatic chuck of claim 3, wherein the aromatic polyamide fibers comprise aramid fibers.

5. The puncture resistant electrostatic chuck of claim 4, wherein layer of fibers comprises from about 20 to about 50 volume percent aramid fibers with the balance comprising the polyimide matrix.

6. The puncture resistant electrostatic chuck of claim 1, wherein the layer of fibers comprises at least one of the following properties:
   a) a tenacity of at least about 10 g/denier;
   (b) a stiffness of at least about 100 g/denier; or
   (c) a tensile strength of at least about $80 \times 10^3$ psi.

7. The puncture resistant electrostatic chuck of claim 1, wherein the layer of fibers comprises (i) non-woven randomly oriented fibers, or (ii) woven and oriented fibers.

8. The puncture resistant electrostatic chuck of claim 1, wherein the layer of fibers comprises aromatic polyamide fibers intermeshed in a paper, felt, cloth, or weave structure.

9. A puncture resistant electrostatic chuck having a conformal holding surface for holding a substrate in a process environment, the chuck comprising:
   (a) at least one electrode; and
   (b) an insulator covering the electrode, the insulator comprising:
      (i) a substantially planar, conformal, and resilient holding surface capable of conforming to the substrate under application of an electrostatic force generated by the electrode to form a seal along the peripheral edge of the substrate, thereby reducing leakage of heat transfer gas held between the substrate and the holding surface; and
      (ii) a hard aromatic polyamide layer below the holding surface that covers substantially the entire electrode, and is sufficiently hard to increase the puncture resistance of the insulator.

10. The puncture resistant chuck of claim 9, wherein the holding surface comprises a surface of a polyimide layer, and the hard aromatic polyamide layer comprises a layer of fibers positioned below the polyimide layer.

11. The puncture resistant electrostatic chuck of claim 10, wherein the layer of fibers comprise (i) non-woven, randomly oriented, fibers, or (ii) woven and oriented fibers.

12. The puncture resistant electrostatic chuck of claim 10, wherein the layer of fibers comprises a layer of aramid fibers.

13. The puncture resistant electrostatic chuck of claim 9, wherein the hard aromatic polyamide layer comprises a substantially planar and continuous aramid layer positioned above the electrodes.

14. The puncture resistant electrostatic chuck of claim 9, wherein the electrode comprises electrode segments, and wherein the hard aromatic polyamide layer comprises planar aramid segments positioned above, and sized to cover the electrode segments.

15. The puncture resistant electrostatic chuck of claim 9, wherein the hard aromatic polyamide layer comprises at least one of the following properties:
   (a) a tenacity of at least about 10 g/denier;
   (b) a stiffness of at least about 100 g/denier; or
   (c) a tensile strength of at least about $80 \times 10^3$ psi.

16. A puncture resistant electrostatic chuck having a conformal holding surface for holding a substrate in a process environment, the chuck comprising:
   (a) at least one electrode; and
   (b) a composite insulator covering the electrode, the composite insulator comprising:
      (i) a polyimide layer having a substantially planar and conformal holding surface capable of conforming to the substrate electrostatically held on the chuck to reduce leakage of heat transfer gas held between the substrate and the holding surface; and
      (ii) an aromatic polyamide fiber layer positioned below the polyimide layer, the fiber layer being sufficiently hard to increase the puncture resistance of the composite insulator.

17. The puncture resistant electrostatic chuck of claim 16, wherein the aromatic polyamide fiber layer comprises (i) non-woven randomly oriented fibers, or (ii) woven and oriented fibers.

18. The puncture resistant electrostatic chuck of claim 16, wherein the aromatic polyamide fiber layer comprises aramid fibers.

19. The puncture resistant electrostatic chuck of claim 16, wherein the aromatic polyamide fiber layer comprises aramid fibers in a polyimide matrix.

20. The puncture resistant electrostatic chuck of claim 16, comprising heat transfer gas grooves extending through the polyimide layer and the aromatic polyamide fiber layer.

21. The puncture resistant electrostatic chuck of claim 16, wherein the polyimide layer comprises a thickness of from about 5 μm to about 250 μm, and the aromatic polyamide fiber layer comprises a thickness of from about 5 μm to about 250 μm.

22. The puncture resistant electrostatic chuck of claim 16, wherein the composite insulator comprises at least one of the following characteristics:
   (a) a dielectric breakdown strength of at least about 1000 volts/mil;
   (b) a resistivity of from about $10^{11}$ Ω cm to $10^{20}$ Ω cm; or
   (c) a dielectric constant of at least about 3.

23. A method of forming a puncture-resistant electrostatic chuck comprising the steps of:
   (a) forming an insulator comprising:
      (i) one or more electrodes, and
      (ii) a composite insulator layer covering the electrodes, the composite insulator layer comprising (i) a conformal holding surface capable of conforming to the substrate under application of an electrostatic force generated by the electrode to reduce leakage of heat transfer gas held between the substrate and the holding surface, and (ii) a layer of fibers positioned below the holding surface, the layer of fibers being sufficiently hard to increase the puncture resistance of the insulator; and
   (b) positioning and adhering the insulator on a base.

24. The method of claim 23, wherein in step (a) the composite insulator layer comprises a polyimide matrix.

25. The method of claim 23, wherein in step (a) the layer of fibers comprises aromatic polyamide fibers.

26. The method of claim 25, wherein in step (a) the layer of fibers comprises aramid fibers.

27. The method of claim 26, wherein in step (a) the aramid fibers are impregnated with a partially stabilized polyimide matrix.

28. The method of claim 23, wherein step (a) further comprises the step of cutting grooves in the insulator by punching, stamping, pressing, or laser ablation.

29. The method of claim 23, wherein step (b) comprises the step of pressure forming the insulator on the base.

30. A method of forming a puncture-resistant electrostatic chuck comprising the steps of:
   (a) forming a multilayer composite insulator having precut heat transfer fluid grooves therein, the insulator formed by the steps of:
      (i) forming a first insulator layer having an electrode thereon;
      (ii) cutting a pattern of first grooves in a fiber layer to form a precut fiber layer;
      (iii) placing the precut fiber layer over the electrode of the first insulator layer;
      (iv) positioning a second insulator layer on the precut fiber layer; and
      (v) cutting second grooves through the second insulator layer, the first and second grooves being substantially being aligned to one another to form the precut heat transfer fluid grooves; and
   (b) adhering the multilayer composite insulator to a base.

31. The method of claim 30, wherein in step (a) the first and second insulator layers comprise polyimide layers.

32. The method of claim 30, wherein in step (a)(ii) the fiber layer comprises aromatic polyamide fibers.

33. The method of claim 32, wherein in step (a)(ii) the fiber layer comprises aramid fibers.

34. The method of claim 33, wherein in step (a)(ii) the aramid fibers are impregnated with a partially stabilized polyimide matrix.

35. The method of claim 30, wherein in step (a) the first and second grooves are formed by punching, stamping, pressing, or laser ablation.

36. The method of claim 30, wherein step (b) comprises the step of pressure forming the multilayer composite insulator onto the base.

37. A method of forming a puncture-resistant electrostatic chuck comprising the steps:
   (a) forming a laminate comprising (i) a lower polymer layer having an electrode thereon, (ii) an intermediate fiber layer covering the electrode; and (iii) an upper polymer layer over the fiber layer;
   (b) cutting grooves through the laminate to form a precut laminate comprising a pattern of grooves sized and distributed to hold heat transfer fluid therein; and
   (c) positioning the precut laminate on a base and applying a pressure on the laminate to adhere the laminate to the base.

38. The method of claim 37, wherein the first and second polymer layers comprise polyimide layers.

39. The method of claim 37, wherein in step (b), the grooves in the laminate are formed by the steps of:
   (a) forming a patterned resist layer on the multilayer insulator, the resist layer patterned in the configuration of grooves; and
   (b) etching the grooves through the exposed portions of the resist layer.

40. The method of claim 37, wherein in step (b), the grooves in the laminate are formed by punching, stamping, pressing, or laser ablation.

41. The method of claim 37, wherein in step (a) the lower and upper polymer layers comprise polyimide layers.

42. The method of claim 37, wherein in step (a) the intermediate fiber layer comprises aromatic polyamide fibers.

43. The method of claim 42, wherein in step (a) aromatic polyamide fibers comprise aramid fibers.

44. The method of claim 43, wherein in step (a) the aramid fibers are impregnated with a partially stabilized polyimide matrix.

45. The method of claim 37, wherein step (c) comprises the step of applying a pressure on the laminate in a pressure forming apparatus.

* * * * *